(12) United States Patent
Goller et al.

(10) Patent No.: US 6,953,992 B2
(45) Date of Patent: Oct. 11, 2005

(54) ELECTRONIC COMPONENT WITH AT LEAST ONE SEMICONDUCTOR CHIP AND METHOD FOR ITS MANUFACTURE

(75) Inventors: Bernd Goller, Kemnath (DE); Robert-Christian Hagen, Sarching (DE); Gerald Ofner, Bad Abbach (DE); Christian Stümpfl, Schwandorf (DE); Josef Thumbs, Breitenbrunn (DE); Stefan Wein, Regensburg (DE); Holger Wörner, Regensburg (DE)

(73) Assignee: Infineon Technologies AG, Munich (DE)

( * ) Notice: Subject to any disclaimer, the term of this patent is extended or adjusted under 35 U.S.C. 154(b) by 86 days.

(21) Appl. No.: 10/247,966

(22) Filed: Sep. 20, 2002

(65) Prior Publication Data

US 2003/0071336 A1 Apr. 17, 2003

(30) Foreign Application Priority Data

Sep. 20, 2001 (DE) ........................................ 101 46 436

(51) Int. Cl.[7] .................... H01L 23/48; H01L 25/52; H01L 23/495
(52) U.S. Cl. ................... 257/690; 257/692; 257/666
(58) Field of Search ............................ 257/778–786, 257/666–667, 690–700, 735–738, 787–789

(56) References Cited

U.S. PATENT DOCUMENTS

| | | | |
|---|---|---|---|
| 5,218,168 A | | 6/1993 | Mitchell et al. |
| 5,349,238 A | | 9/1994 | Ohsawa et al. |
| 5,631,191 A | * | 5/1997 | Durand et al. .............. 438/119 |
| 5,772,451 A | * | 6/1998 | Dozier et al. ................. 439/70 |
| 5,903,443 A | * | 5/1999 | Schoenfeld et al. ........ 361/813 |
| 6,124,151 A | | 9/2000 | Jiang et al. |
| 2001/0012739 A1 | * | 8/2001 | Grube et al. ................ 439/862 |
| 2001/0023985 A1 | * | 9/2001 | Beroz et al. ................ 257/737 |
| 2001/0030355 A1 | * | 10/2001 | McIellan et al. ............ 257/666 |
| 2002/0164893 A1 | * | 11/2002 | Mathieu et al. ............... 439/66 |

FOREIGN PATENT DOCUMENTS

DE 44 16 980 C2 11/1995

OTHER PUBLICATIONS

US 5,455,394, 10/1995, Durand et al. (withdrawn)*

* cited by examiner

Primary Examiner—Shouxiang Hu
(74) Attorney, Agent, or Firm—Laurence A. Greenberg; Werner H. Stemer; Gregory L. Mayback

(57) ABSTRACT

The invention relates to an electronic component having at least one semiconductor chip and a flat chip carrier assigned to the semiconductor chip. Electrical connections between contact areas on an active chip surface of the semiconductor chip and contact terminal areas on an upper side of the chip carrier are formed by strips of material that can undergo microstructuring and that are provided with an electrically conductive coating. The invention also relates to a method for producing the electronic component.

8 Claims, 2 Drawing Sheets

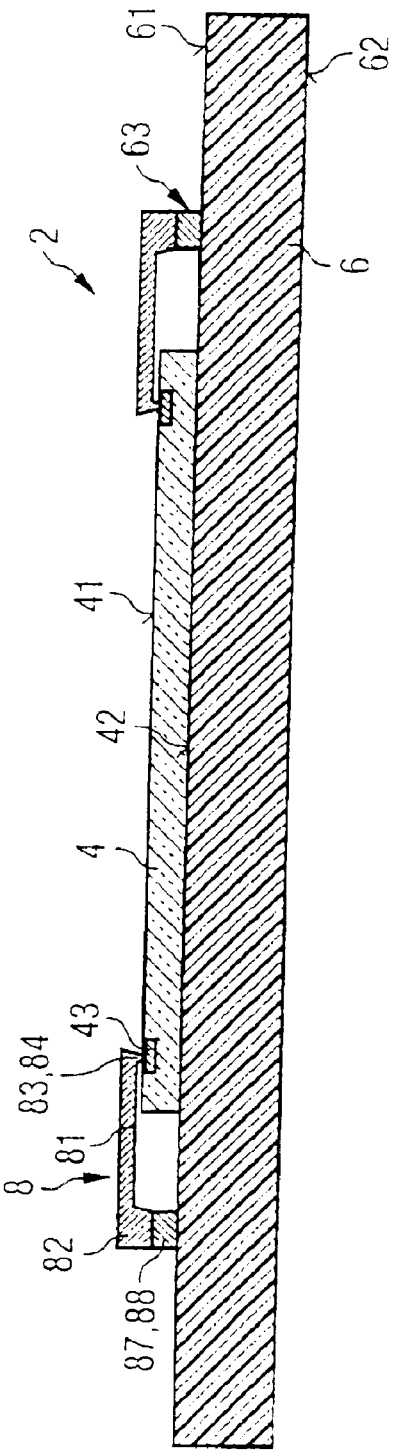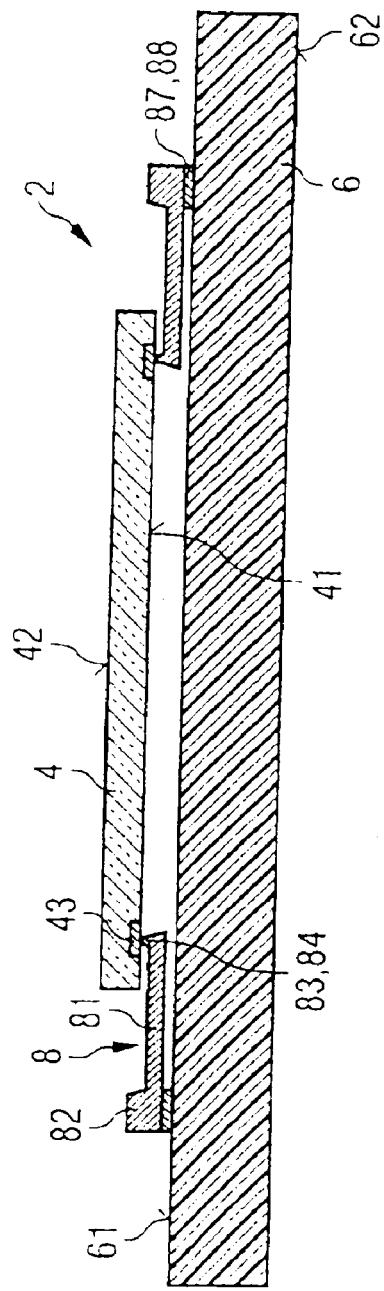

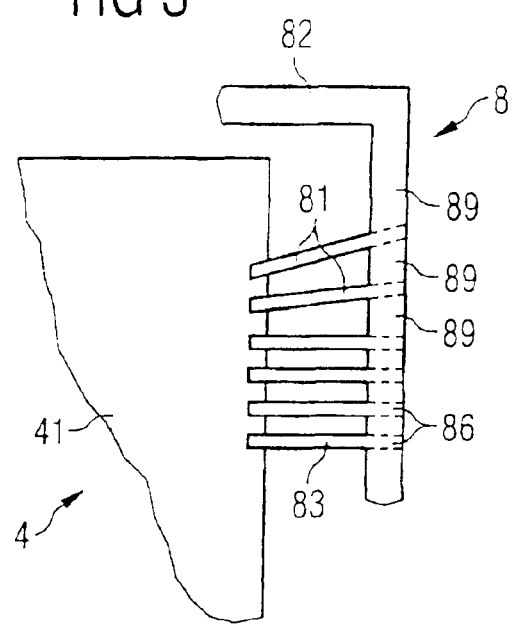
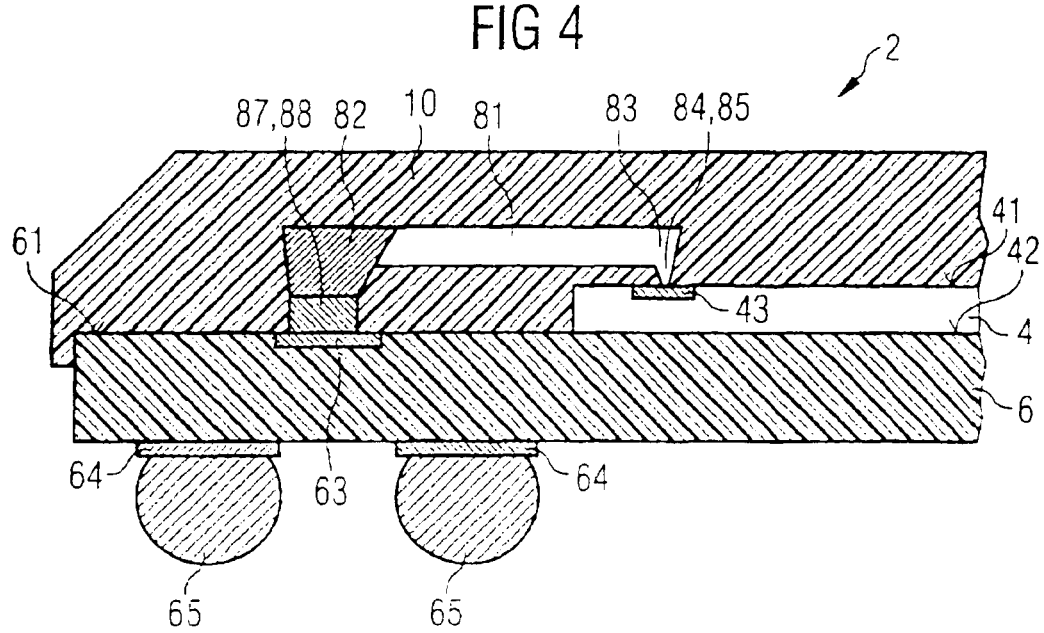

ELECTRONIC COMPONENT WITH AT LEAST ONE SEMICONDUCTOR CHIP AND METHOD FOR ITS MANUFACTURE

BACKGROUND OF THE INVENTION

Field of the Invention

The invention relates to an electronic component with at least one semiconductor chip and a method for producing the component.

Suitable for example for producing electronic connections of a semiconductor chip in an electronic semiconductor component are the wire-bonding or the flip-chip method, as they are known, in which contact areas on an active chip surface have what are known as flip-chip bumps, which are placed onto corresponding contact terminal areas of a wiring board or the like and connected to the latter. However, with increasingly smaller contact structures of the semiconductor chip, contacts made by means of wire-bonding connections are reaching the limits of their feasibility with regard to process technology and production costs. Moreover, on account of the sequential method of contacting the individual terminals, the cycle times required for a component are relatively long.

Although flip-chip technology has the advantage of a parallel contacting method, fanning out of the flip-chip contacts to a pattern which can be processed on the printed circuit board is necessary. This fanning out, which may take place by means of single- or multi-layer substrates, necessitates a specific substrate design for each chip type and consequently represents a significant cost factor. The substrates themselves additionally represent a high proportion of the overall package costs, in particular when multi-layer substrates are used.

In flip-chip technology, a further essential method step has to be added, since a gap between the semiconductor chip and the substrate must be filled with a filling material to allow compensation for the different coefficients of thermal expansion of the components. The application of this filling material represents a further cost factor.

SUMMARY OF THE INVENTION

One aim of the invention is to provide a low-cost possible way of contacting semiconductor chips which, moreover, is also suitable for the contacting of very small structures.

To achieve this aim of the invention, an electronic component with at least one semiconductor chip and a flat chip carrier assigned to the at least one semiconductor chip is proposed. According to the invention, electrical connections between contact areas on an active chip surface of the semiconductor chip and contact terminal areas on an upper side of the chip carrier are formed by means of elastic strips of material which can undergo microstructuring. These strips have in each case an electrically conducting coating.

This electronic component according to the invention has the advantage of allowing a high degree of miniaturization on account of the elastic strips which can be produced by a microstructuring technique. The elastic strips can be produced in a microscopic size, i.e. in structure sizes which are perceptible only under an optical microscope. The micromechanical structuring of the individual elastic strips allows extremely small geometrical dimensions to be realized. This allows smaller spacings of the contact areas of the semiconductor chip and consequently a low pad pitch, as it is known, on the semiconductor chip. The requirements of future chip technologies can be met with such a component.

Particularly suitable as materials which can undergo microstructuring are nonmetallic materials, in particular glass, ceramic or a semiconductor material. Materials of this type can be produced in wafer form, and wafers of this type can be microstructured by means of etching techniques. Since the material used for the strips does not conduct the electrical current, it is coated with a conducting material. Suitable in particular as semiconductor material for the strips is silicon, which is produced by applying conducting layers or by structuring metallization layers.

According to a further embodiment of the invention, the strips are formed in one piece with a flat frame element, whereby a compact component for reliable electrical contacting of the semiconductor chip is provided. The production of the electrical connections of the semiconductor chip to the contact terminal areas of the chip carrier takes place in a single parallel step. This ensures very short cycle times per component.

In the case of a further embodiment of the invention, strips point inward in the manner of fingers from a frame of the frame element in the direction of the contact areas of the semiconductor chip. By utilizing the elastic properties of the strip material, for which silicon is suitable for example, along with small structure dimensions, a mechanically extremely robust component is provided. The microscopic contact areas on the semiconductor chip are contacted by means of the frame element with respect to macroscopic structures, i.e. structures perceptible to the naked eye, of contact terminal areas on the upper side of the chip carrier.

When there are thermally induced different changes in length in the construction, the stresses occurring are compensated by a deflection of the spring elements, which thereby act as bending beams. Additional mechanical isolating structures, such as notches or lateral incisions or comb structures in the spring elements, can lead to further improvement of their mechanical properties.

One embodiment of the invention provides that free ends of the strips in each case have a raised contact region, the tip of which rests resiliently on a contact area of the semiconductor chip. The contact areas and the free ends must be mechanically securely connected to one other for a reliable electrical contact. Possible methods for this are adhesive bonding with conductive adhesives, microwelding, thermosonic and ultrasonic bonding. The flexibility of the connection is achieved by the structure of the strips. Very reliable electrical contacting bonds are provided in this way.

According to a further embodiment of the invention, the semiconductor chip is attached with a passive rear side on the upper side of the chip carrier, for example by means of a layer of adhesive or solder or the like. This leads to a mechanically very stable component.

According to an alternative refinement of the invention, the semiconductor chip rests with its contact areas, facing the upper side of the chip carrier, on the upwardly pointing tips of the strips. In the case of this face-down variant, as it is known, the entire semiconductor chip is mounted resiliently on the strips, which leads to mechanical and thermal isolation of the semiconductor chip from the chip carrier.

One embodiment of the invention provides that the frame element is connected in a mechanically and electrically conducting manner to contact terminal areas on the upper side of the chip carrier by means of points of conductive adhesive. These connections may also be optionally achieved by means of solder connections or by means of microwelding bonds. All these joining methods lead to connections which are stable and have good electrical conduction.

Finally, a further embodiment of the invention provides that the electronic component has a plastic package which encloses at least the at least one semiconductor chip, the frame element and the upper side of the chip carrier and brings about a shielding of the semiconductor chip and its connecting parts against external influences.

A method for producing an electronic component with at least one semiconductor chip and a flat chip carrier assigned to the at least one semiconductor chip, in which method electrical connections are effected between contact areas on an active chip surface of the semiconductor chip and contact terminal areas on an upper side of the chip carrier by means of elastic strips provided with an electrically conducting coating, has the method steps described below.

A flat chip carrier with contact terminal areas on an upper side and external contact areas on a rear side is provided. Furthermore, a semiconductor chip is attached with its passive rear side on the upper side of the chip carrier. Subsequently, a frame element of material which can undergo microstructuring and comprises a frame with inwardly pointing strips is applied onto the upper side of the chip carrier. Free ends of the strips provided with an electrically conducting coating rest on contact areas of the semiconductor chip. Finally, a plastic package is applied at least onto the upper side of the chip carrier.

This method according to the invention permits the production of an electronic component with reliable electrical contacting bonds in very short cycle times.

In an alternative method for producing an electronic component according to the embodiment described above, the following method steps are provided. After the provision of a flat chip carrier with contact terminal areas on an upper side and external contact areas on a rear side, a frame element of material which can undergo microstructuring and comprises a frame with inwardly pointing strips is applied onto the upper side of the chip carrier, free ends of the strips provided with an electrically conducting coating pointing in a direction away from the surface of the chip carrier. The semiconductor chip is placed with its contact areas onto free ends of the strips, after which a plastic package is applied at least onto the upper side of the chip carrier.

This alternative method for producing the electronic component according to the invention likewise permits very short cycle times. Moreover, the semiconductor chip is thereby largely isolated mechanically from the chip carrier.

One refinement of the method provides that the frame element is connected in a mechanically and electrically conducting manner to the contact terminal areas on the upper side of the chip carrier by means of points of conductive adhesive, which leads to electrical connections which are reliable and can be produced at low cost.

An alternative method provides that the frame element is connected in a mechanically and electrically conducting manner to the contact terminal areas on the upper side of the chip carrier by means of solder connections, which likewise leads to low-cost, mechanically and electrically secure connections.

One refinement of the method according to the invention provides that the frame elements are produced at wafer level, in particular from a semiconductor wafer, a glass wafer or a ceramic wafer, by etching and metallizing, and are subsequently individualized. The micromechanical wafer process as a parallel process has high cost efficiency. Moreover, the structuring of the frame elements can be realized by simple etching processes.

The connection technique according to the invention can be used universally, both at package level and in the case of chip-on-board constructions, and can be provided as platform technology for a wide variety of applications. The outward connection patterns toward the printed circuit board can be standardized for specific groups of chip sizes, allowing a further cost reduction to be achieved.

On account of the very flat configuration of the frame elements according to the invention for contacting the semiconductor chips, very low overall heights of the electronic component can be realized.

The invention is now explained in more detail on the basis of embodiments with reference to the accompanying figures.

BRIEF DESCRIPTION OF THE DRAWINGS

FIG. 1 shows a schematic sectional representation of a first variant of an electronic component according to the invention.

FIG. 2 shows a schematic sectional representation of a further variant of the electronic component according to the invention.

FIG. 3 shows a schematic partial plan view of the electronic component according to FIG. 1 or FIG. 2.

FIG. 4 shows a schematic partial sectional view of the electronic component according to FIG. 1.

DESCRIPTION OF THE PREFERRED EMBODIMENTS

FIG. 1 shows in a schematic sectional view an electronic component 2 according to the invention, which comprises a flat chip carrier 6 and a semiconductor chip 4 applied on it. The passive rear side of the semiconductor chip 4 has been applied on an upper side 61 of the flat chip carrier 6. The connection between the semiconductor chip 4 and the chip carrier 6 may take place for example by means of a layer of adhesive or solder.

Provided on the active chip surface 41 of the semiconductor chip 4 are a multiplicity of contact areas 43, which serve for the electrical contacting of the semiconductor circuits of the semiconductor chip 4. A frame element 8 of semiconductor material, for which silicon comes into consideration for example, comprises a frame 82 and strips 81 protruding inward from the latter in the same plane, in this exemplary embodiment of silicon, which serve for the contacting of the contact areas 43 of the semiconductor chip 4. The frame 82 of the frame element 8 is mechanically and electrically connected to contact terminal areas 63 on the upper side 61 of the chip carrier 6 by means of points of conductive adhesive 87 and/or solder connections 88. The strips 81 have at their free ends 83 in each case a contact region 84, which comprises a tip 85 which can rest resiliently on a contact area 43 of the semiconductor chip 4.

To be able to establish a reliable electrical contact, the strips 81 are in each case provided with an electrically conducting layer, for example in the form of a metallization, which is in electrically conducting connection with the corresponding contact terminal areas 63 of the chip carrier 6 by means of the points of conductive adhesive 87 or the solder connections 88.

A plastic package covering at least the upper side 61 of the chip carrier 6 and enclosing the semiconductor chip 4 and the frame element 8 is not depicted in this schematic representation for the sake of better overall clarity.

FIG. 2 shows in a schematic sectional representation an alternative embodiment of the electronic component 2 according to the invention. The same parts as in FIG. 1 are provided with the same reference numerals and some of them are not explained more than once. By contrast with the face-up construction, as it is known, corresponding to FIG. 1, here what is known as a face-down construction is shown, in which the active chip surface 41 of the semiconductor chip 4 is facing the upper side 61 of the chip carrier 6 and in which the semiconductor chip 4 is supported with its contact areas 43 in each case by means of the tips 85 of the strips 81.

The semiconductor chip 4 is in this case carried exclusively by the strips 81 of the frame element 8 before the electronic component 2 is surrounded by a package in a subsequent method step (cf. FIG. 4).

For this purpose, the entire upper side 61 of the chip carrier 6 can be surrounded together with the semiconductor chip 4 and the frame element 8 by a plastic package, for example by means of transfer molding or the globe-top method.

The connection of the frame 82 of the frame element 8 by means of the points of conductive adhesive 87 and/or solder connections 88 corresponds to the previously described construction according to FIG. 1.

FIG. 3 shows in a schematic partial view a plan view of a corner region of a frame element 8 and of a semiconductor chip 4. The strips 81 attached to the frame 82 and pointing inward, which in each case produce electrical connections between contact areas 43 of the semiconductor chip 4 and contact terminal areas of the chip carrier 6, can be seen here.

To be able to conduct the electrical current, the strips 81 have in each case an electrically conducting coating, for example in the form of a metallization, which however may only partly cover the frame 82. The coatings 86 of the strips 81, reaching up as far as the frame, are respectively separated by isolating regions 89. There may then be respectively applied on the coatings 86 of the frame 82 points of conductive adhesive 87 or individual solder connections 88, which can in each case produce an electrically conducting connection with respect to individual contact terminal areas 63 of the chip carrier, which connections may moreover provide the mechanical fixing of the frame element 8 on the upper side of the chip carrier.

FIG. 4 finally shows a partial section of an electronic component 2 in an enlarged representation, on the basis of which the structure of the frame element 8 and the strips 81 is illustrated. The frame 82 of the frame element 8 has been applied on the upper side 81 of the chip carrier 6 by means of points of conductive adhesive 87 and/or solder connections 88.

Fastened to the frame 82 are a multiplicity of strips 81, which act as elastic contact strips and produce an electrical connection between the contact areas 43 of the semiconductor chip 4 and contact terminal areas 63 of the chip carrier 6. The contact terminal areas 63 on the upper side 61 of the chip carrier 6 are electrically connected to external contact areas 64 on a rear side of the chip carrier 6. On the external contact areas 64 there may be attached, for example, external contacts 65 in the form of contact bumps or the like for the mounting of the chip carrier 6 on a printed circuit board or the like.

An individual strip 81 has in each case at its free end 83 a tip 85, which points downward to the contact area 43 and is pressed resiliently onto the contact area 43. The upper side 61 of the chip carrier 6 is preferably surrounded by a plastic package 10, which moreover encloses the semiconductor chip 4 and also the entire frame element 8 with the strips 81 in a sealing manner.

In the case of a method according to the invention for producing the electronic component 2, firstly the flat chip carrier 6 with contact terminal areas 63 on its upper side 61 and with external contact areas 64 on its rear side 62 is provided. In the case of a first embodiment according to FIG. 1, the semiconductor chip 4 is attached with its passive rear side 42 on the upper side 61 of the chip carrier 6, after which the frame element 8 of material which can undergo microstructuring, such as a semiconductor material, is applied onto the upper side 61 of the chip carrier 6. The free ends of the electrically conducting strips 81, which are fastened to the frame 82, rest on the contact areas 43 of the semiconductor chip 4. Finally, a plastic package is applied at least onto the upper side 61 of the chip carrier 6.

In the case of an alternative method for producing the electronic component according to FIG. 2, firstly the frame element 8 of material which can undergo microstructuring, such as a semiconductor material, is applied onto the upper side 61 of the chip carrier 6, so that free ends 83 of the strips 81, provided with an electrically conducting coating, point in a direction away from the surface 61 of the chip carrier 6. The semiconductor chip 4 is placed with its contact areas 43 onto the free ends 83 of the frame element 8. Finally, a plastic package 10 is applied onto the upper side 61 of the chip carrier 6.

The plastic package 10 may preferably be applied by means of a transfer-molding method or by means of a globe-top method. The electronic component 2 is subsequently suitable for mounting on a printed circuit board or the like.

We claim:

1. An electronic component, comprising:
   at least one semiconductor chip having an active chip surface with a plurality of contact areas;
   a flat chip carrier assigned to the at least one semiconductor chip, said chip carrier having an upper side with a plurality of contact terminal areas; and
   a frame element including a frame and a plurality of elastic strips protruding inwardly from said frame in the same plane as said frame;
   said plurality of elastic strips each including a contact region with a tip;
   each one of said plurality of said strips having an electrically conducting coating; and
   said plurality of said contact areas of said semiconductor chip being electrically connected to said plurality of said contact terminal areas of said chip carrier by said tip and said electrically conducting coating,
   wherein each one of said plurality of said strips includes a nonmetallic material formed from a same layer of said frame; and,
   wherein each one of said plurality of said elastic strips has a free end with a raised portion forming said contact region with said tip; said tip rests resiliently on a respective one of said plurality of said contact areas of said semiconductor chip; and said tip is mechanically securely connected to said one of said plurality of said contact areas of said semiconductor chip.

2. The electronic component according to claim 1, wherein said non-metallic material is selected from a group consisting of a glass material, a ceramic material, and a semiconductor material.

3. The electronic component according to claim 2, wherein said electrically conducting coating is a metallization.

4. The electronic component according to claim 1, wherein said frame element forms a single piece with said plurality of said elastic strips.

5. The electronic component according to claim 1, wherein said semiconductor chip has a passive rear side attached to said upper side of said chip carrier.

6. The electronic component according to claim 1, comprising:
   a plurality of areas of conductive adhesive mechanically and electrically connecting said frame element to said plurality of said contact terminal areas on said upper side of said chip carrier.

7. The electronic component according to claim 1, comprising:
   a plurality of solder connections mechanically and electrically connecting said frame element to said plurality of said contact terminal areas on said upper side of said chip carrier.

8. The electronic component according to claim 1, comprising:
   a plastic package enclosing at least said semiconductor chip, said frame element and said upper side of said chip carrier.

* * * * *